United States Patent
Bacigalupo

(10) Patent No.: US 7,389,458 B2
(45) Date of Patent: Jun. 17, 2008

(54) METHOD AND APPARATUS FOR THE MEMORY SELF-TEST OF EMBEDDED MEMORIES IN SEMICONDUCTOR CHIPS

(75) Inventor: Tommaso Bacigalupo, Fuerstenfeldbruck (DE)

(73) Assignee: Infineon Technologies AG, Munich (DE)

( * ) Notice: Subject to any disclaimer, the term of this patent is extended or adjusted under 35 U.S.C. 154(b) by 319 days.

(21) Appl. No.: 11/078,668

(22) Filed: Mar. 11, 2005

(65) Prior Publication Data
US 2005/0204234 A1    Sep. 15, 2005

(30) Foreign Application Priority Data
Mar. 12, 2004   (DE) ..................... 10 2004 012 279

(51) Int. Cl.
*G01R 31/28* (2006.01)
(52) U.S. Cl. .................. 714/733; 714/718
(58) Field of Classification Search .......... 711/172; 714/718, 30, 733, 720, 725; 365/201
See application file for complete search history.

(56) References Cited

U.S. PATENT DOCUMENTS

| | | | | |
|---|---|---|---|---|
| 4,980,850 A | * | 12/1990 | Morgan | 711/172 |
| 5,222,066 A | * | 6/1993 | Grula et al. | 714/718 |
| 5,617,531 A | * | 4/1997 | Crouch et al. | 714/30 |
| 5,974,579 A | * | 10/1999 | Lepejian et al. | 714/733 |
| 5,983,009 A | * | 11/1999 | Lepejian et al. | 716/18 |
| 6,587,979 B1 | * | 7/2003 | Kraus et al. | 714/720 |
| 6,681,354 B2 | | 1/2004 | Gupta | 714/725 |
| 6,829,728 B2 | * | 12/2004 | Cheng et al. | 714/30 |
| 7,038,955 B2 | * | 5/2006 | Susuki et al. | 365/201 |
| 7,117,408 B2 | * | 10/2006 | Dixit et al. | 714/720 |

* cited by examiner

*Primary Examiner*—David Ton
(74) *Attorney, Agent, or Firm*—Eschweiler & Associates, LLC

(57) ABSTRACT

Method for the memory self-test of embedded memories (2, 3, 4) in semiconductor chips (1), a memory address range (8) being assigned to a memory (2) to be tested and addresses from the same memory address range of the memory to be tested being allocated to at least one memory self-test controller register (6R2) of a memory self-test controller for storing memory test configuration data.

20 Claims, 6 Drawing Sheets

METHOD AND APPARATUS FOR THE MEMORY SELF-TEST OF EMBEDDED MEMORIES IN SEMICONDUCTOR CHIPS

PRIORITY

This application claims priority to German Patent application no. 10 2004 012 279.2 filed Mar. 12, 2004.

TECHNICAL FIELD OF THE INVENTION

The present invention relates to a method and an apparatus for the memory self-test of embedded memories in semiconductor chips.

BACKGROUND OF THE INVENTION

Advances in semiconductor design and fabrication methods enable increasing miniaturization of electronic circuits. Complete systems comprising microprocessors, communication logic and, in particular, memories can be found on a single semiconductor chip in this case. Such systems-on-a-chip (SOC) have a multiplicity of technologies that previously had a high space requirement as separate components on a circuit board.

Whereas in the past semiconductor chips were dominated by logic functions and separate memories were provided externally, modern integrated circuits increasingly require embedded memories on the semiconductor chip itself. Embedded memories may be present in semiconductor chips as different memory blocks in different sizes and forms. As a result of the integration of memories on a semiconductor chip, it is possible to save space and the speed of memory accesses can be increased as a result of obviating interfaces and speed-retarding factors such as circuit boards.

Embedded memories in a system-on-a-chip have to be very reliable and tested accordingly. Therefore, a memory self-test controller is usually provided in a system-on-a-chip having embedded memories, said controller being tailored to the embedded memories provided in the system. Such a memory self-test controller (BIST—built-in self-test) then carries out a memory self-test for example after the fabrication of the corresponding semiconductor chip or else each time the SOC is started up.

By way of example, the U.S. Pat. No. 6,681,354 B2 describes a semiconductor chip self-test apparatus that is controlled by means of an internal configurable bus. In this case, an FPGA (field-programmable gate array) carries out a memory test program in externally triggered fashion. After the end of the test, the corresponding FPGA is used to carry out further functions.

FIG. 1 schematically shows a semiconductor chip SOC having embedded memories M1, M2, M3 and a memory self-test controller BIST according to the prior art.

The semiconductor chip SOC or the system on a semiconductor chip has embedded memories M1, M2, M3 coupled to a bus system L, S, A. The embedded memories M1, M2, M3 each have addressable memory cells which are addressed via an address line A, and are written to or read from via a write/read bus or line L, S. The respective access direction of addressing A, reading L and writing S of the memories M1, M2, M3 is illustrated only by way of example in the figure.

Furthermore, a central chip controller device CPU is provided, which is likewise coupled to the bus system L, S, A for the purpose of addressing, writing and reading of the memories.

A memory self-test controller BIST is additionally provided, which is coupled to the memories M1, M2, M3 via the address bus and the write/read bus. The memory self-test controller BIST can be controlled by an external self-test control signal STS.

The external self-test control signal STS informs the memory self-test controller BIST that a memory self-test is to be carried out. This is generally done after production, but may also be done when the system on the semiconductor chip SOC is started up. After the memory self-test has been carried out by the memory self-test controller BIST, the latter returns a result FS for evaluation to an external test apparatus. The initiation of the memory self-test and the evaluation of the test results FS may also be effected by the chip controller device CPU, as indicated by the dashed lines.

Each of the embedded memories M1, M2, M3 is assigned a memory address range in the address space. This is illustrated schematically in FIG. 2.

The memory address range of a respective memory is defined by a beginning address and an end address. By way of example, the memory cells provided in the embedded memory M1, M2, M3 can be addressed by memory addresses lying between a beginning memory address AM1, AM2, AM3 and an end memory address EM1, EM2, EM3. Furthermore, addresses for registers BIST1, BIST2, BIST3 of the memory self-test controller BIST are kept available in the address space. By way of example, instructions or program codes for the memory test to be carried out are written to the registers BIST1, BIST2, BIST3 of the self-test controller BIST. The registers BIST1, BIST2, BIST3 also include the respective status of the tested memory M1, M2, M3 or the respective test result. Depending on how many embedded memories M1, M2, M3 are provided on a semiconductor chip, it is necessary in each case to provide and define address ranges for the memory self-test controller registers BIST, BIST2, BIST3. The data width and the storage capacity of the respective registers also depend on the embedded memories M1, M2, M3.

A corresponding method for the memory self-test and a semiconductor chip having embedded memories and a memory self-test controller according to the prior art are complex because parts of the address space are occupied by the registers of the self-test controller. Furthermore, a corresponding self-test controller according to the prior art can only be used for one type of semiconductor chips having embedded memories. The self-test controller thus has to be adapted if the memory configuration changes for example through the number or size of the memories.

SUMMARY OF THE INVENTION

Therefore, it is an object of the invention to provide a method and an apparatus for the memory self-test of embedded memories in semiconductor chips which does not cause any limitation of the addressable space and can be used flexibly, i.e. can easily be adapted to different combinations of embedded memories.

According to the invention, this object can be achieved by a method for the memory self-test of embedded memories in semiconductor chips, comprising the steps of assigning a memory address range to a memory to be tested and allocating addresses from the same memory address range of the memory to be tested to at least one memory self-test controller register of a memory self-test controller for storing memory test configuration data.

The object can also be achieved by a semiconductor chip having embedded memories, comprising at least one memory having addressable memory cells which are assigned memory addresses from a memory address range; a memory self-test controller, which has at least one memory self-test controller register, and which is coupled to the memory via an address bus and a read/write bus; a central chip controller device, which is coupled to the memory self-test controller via at least one address line, write line and read line for writing memory test configuration data and at least one control line for a memory self-test controller signal for initiating a memory self-test; addresses of the memory address range being allocated to the at least one memory self-test controller register in a manner dependent on a memory self-test controller signal.

Accordingly, a method for the memory self-test of embedded memories in semiconductor chips is provided, a memory address range being assigned to a memory to be tested and addresses from the same memory address range of the memory to be tested being allocated to at least one memory self-test controller register of a memory self-test controller for storing memory test configuration data.

The idea on which the invention is based consists in mapping the addresses of the memory self-test controller registers onto the addresses of the respective memories to be tested during a memory self-test for system components that access the memory. As a result, the entire addressable space is utilized better for the system on the corresponding semiconductor chip and the number or size of the memory self-test controller registers can be increased without keeping further address space available. Since the corresponding memory is not accessed during a memory self-test, the corresponding memory address range is utilized according to the invention for addressing the registers of the memory self-test controller. Furthermore, the method according to the invention affords the advantage that the registers of the memory self-test controller are merely simply kept available, even for different memories to be tested which are situated in embedded fashion on the semiconductor chip. Even if each memory is respectively assigned a memory self-test controller according to the invention, the method according to the invention offers a simple standardized access scheme to the corresponding memory self-test controller registers. A memory self-test controller operating by the method according to the invention can therefore be used flexibly in semiconductor chips which also have different combinations of embedded memories.

A preferred embodiment of the method according to the invention provides the following steps:

(a) provision of at least one memory to be tested having memory cells which are assigned addresses from the memory address range, the memory cells being addressable, readable and writable;

(b) changing of the assignment of addresses from the memory address range to which the memory cells to be tested are assigned, as a result of which the corresponding addresses are allocated to the at least one memory self-test controller register;

(c) addressing of the addresses allocated to the memory self-test controller register;

(d) writing of memory test configuration data in accordance with the addressing;

(e) selection of addresses of the memory cells to be tested from the memory address range in a manner dependent on the memory test configuration data by the memory self-test controller;

(f) addressing in accordance with the selected addresses of the memory cells to be tested;

(g) writing of test pattern data to the memory cells to be tested and read-out of the corresponding memory cell contents of the memory cells to be tested in accordance with the addressing;

(h) comparison of the test pattern data with the read-out memory contents of the memory cells to be tested, a memory cell defect being identified if a read-out memory cell content deviates from the corresponding test pattern datum that was written in.

The preferred embodiment of the method according to the invention has the advantage that if a memory self-test mode of the system on the semiconductor chip is assumed, the memory self-test controller registers become visible for example to a central chip controller in the address range that was assigned to the memory to be tested. Consequently, it is possible to write memory test configuration data to the memory self-test controller registers and to read test status information simply and above all in a uniform manner for all of the memories to be tested.

In an advantageous manner, the memory self-test is carried out in a subrange of the memory to be tested, in which case the subrange can be determined by a start memory address and a stop memory address. This makes it possible, during operation of the semiconductor chip, to subject only parts of the embedded memories present to a memory self-test. The respective start memory address and stop memory address defining the subrange are then written as part of the memory test configuration data to one of the memory self-test controller registers.

In a preferred embodiment, the memory address range of the memory to be tested is determined by a beginning and an end memory address, and at least the beginning memory address is allocated to a memory self-test controller register. As a result, the beginning memory address of the embedded memories is in each case predefined as standard as a reference address for a respective memory self-test controller register. This preferred allocation simplifies standardization of the method in different semiconductor chips and with different combinations of embedded memories.

In an advantageous manner, a largest contiguous defect-free memory area is identified by repeatedly carrying out the memory test method and changing the start and stop addresses. The test results or row addresses and bit positions of defective memory cells are preferably stored during the memory test in a memory that is not to be tested. This last has the advantage that a central chip controller or the memory self-test controller can derive measures for error handling from knowledge of the addresses of the defective memory cells and the test result, which is stored in a redundancy memory, for example.

Preferably, the test pattern data have a checkerboard pattern comprising binary logic states, so that different binary states are written to directly adjacent memory cells to be tested of the memory. It is furthermore, advantageous if this is done successively in alternative fashion, so that different test pattern data are successively written to the memory cells to be tested and are read.

The invention furthermore provides a semiconductor chip having embedded memories, in particular for carrying out the method according to the invention, having:

(a) at least one memory having addressable memory cells which are assigned memory addresses from a memory address range of the memory to be tested;

(b) a memory self-test controller, which has at least one memory self-test controller register, and which is coupled to the memory via an address bus and a read/write bus;

(c) a central chip controller device, which is coupled to the memory self-test controller via at least one address line, write line and read line for writing memory test configuration data and at least one control line for a memory self-test controller signal for initiating a memory self-test;

(d) addresses of the memory address range being allocated to the at least one memory self-test controller register in a manner dependent on a memory self-test controller signal.

In a preferred development, the memory self-test controller has a control logic having memory self-test controller registers, having an input for the memory self-test controller signal, having an input connected to the address line, an output for a register read signal and having control outputs for outputting control signals. The memory self-test controller evaluates the address signals present on the address line in a manner dependent on the memory self-test controller signal and has an address generator for generating memory addresses and addressing memory cells to be tested in a manner dependent on a second control signal from the control logic, a test data generator, which is coupled to the control logic via at least one control line, for generating and writing test pattern data to the memory cells to be tested in a manner dependent on a third control signal from the control logic, and has a comparison device, which is coupled to the control logic via at least one line and to the test pattern generator via a line, for reading out and comparing the memory cell contents of the memory cells to be tested in a manner dependent on a fourth control signal from the control logic.

In a further development of the invention, provision is made of a redundancy logic having redundancy memory devices for replacing defective memory cells of the memory by at least one redundancy memory device, which is assigned a replacement memory address, said redundancy logic being provided between the memory self-test controller and the address, write and read bus. The redundancy logic, in the event of a memory access to a defective memory cell, in this case directs the corresponding access to a redundancy memory device having the corresponding replacement memory address, and the memory self-test controller, during the memory self-test, writes at least one error bit to the redundancy memory device having the corresponding replacement memory address.

Since defective memory cells in embedded memories are usually compensated for by redundancy memories, these redundancy memories may advantageously serve for receiving defect information during the memory test, indicating the addresses and bit positions of the defective memory cells.

Further advantageous refinements and developments of the invention are the subject matter of the subclaims and of the description with reference to the drawings.

BRIEF DESCRIPTION OF THE DRAWINGS

The invention is explained in more detail below with reference to the schematic figures and the exemplary embodiments. In this case.

DETAILED DESCRIPTION OF THE PREFERRED EMBODIMENTS

Unless specified otherwise, identical or functionally identical elements are provided with the same reference symbols in the figures.

Figure 1:
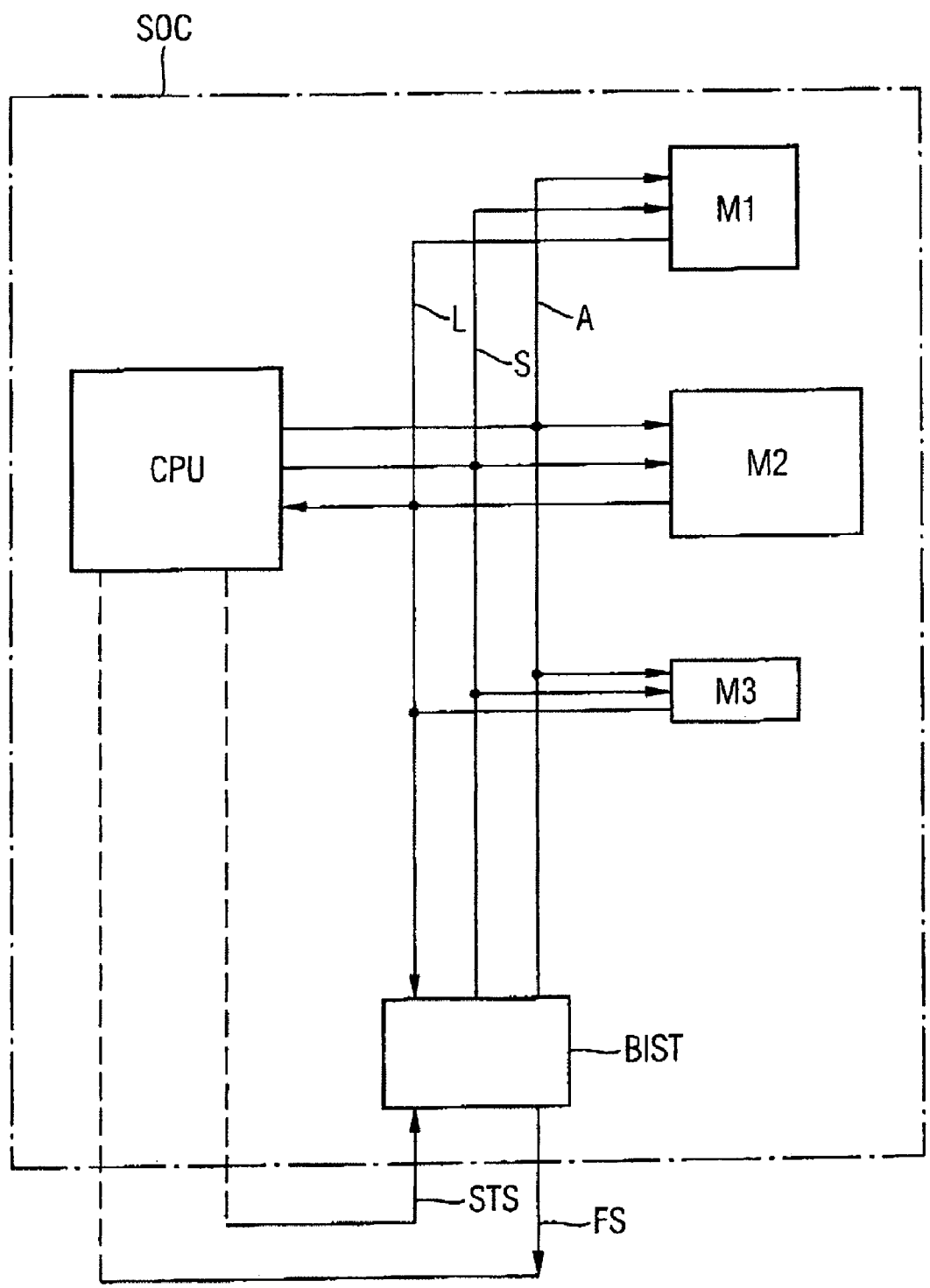
FIG. 1 shows a semiconductor chip having embedded memories and a memory self-test controller according to the prior art.
Figure 2:
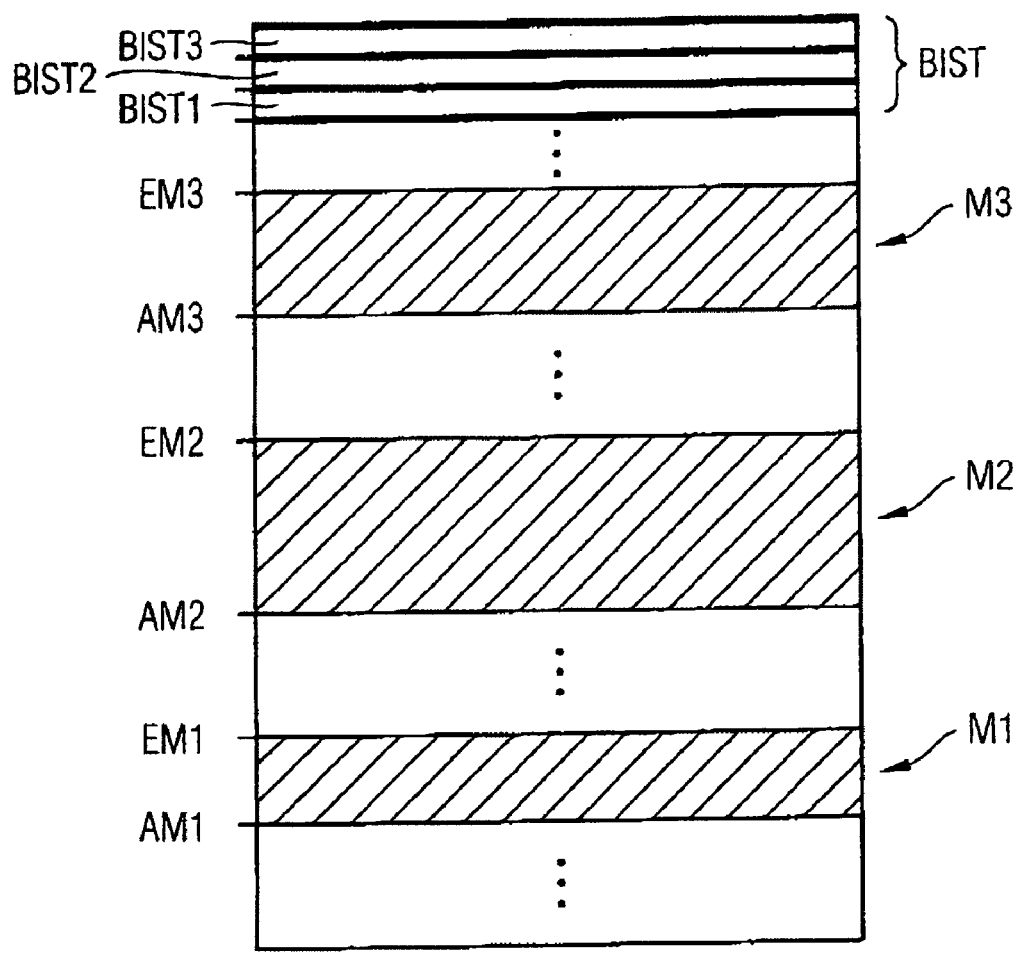
FIG. 2 shows a schematic illustration of the address space according to the prior art.
Figure 3:
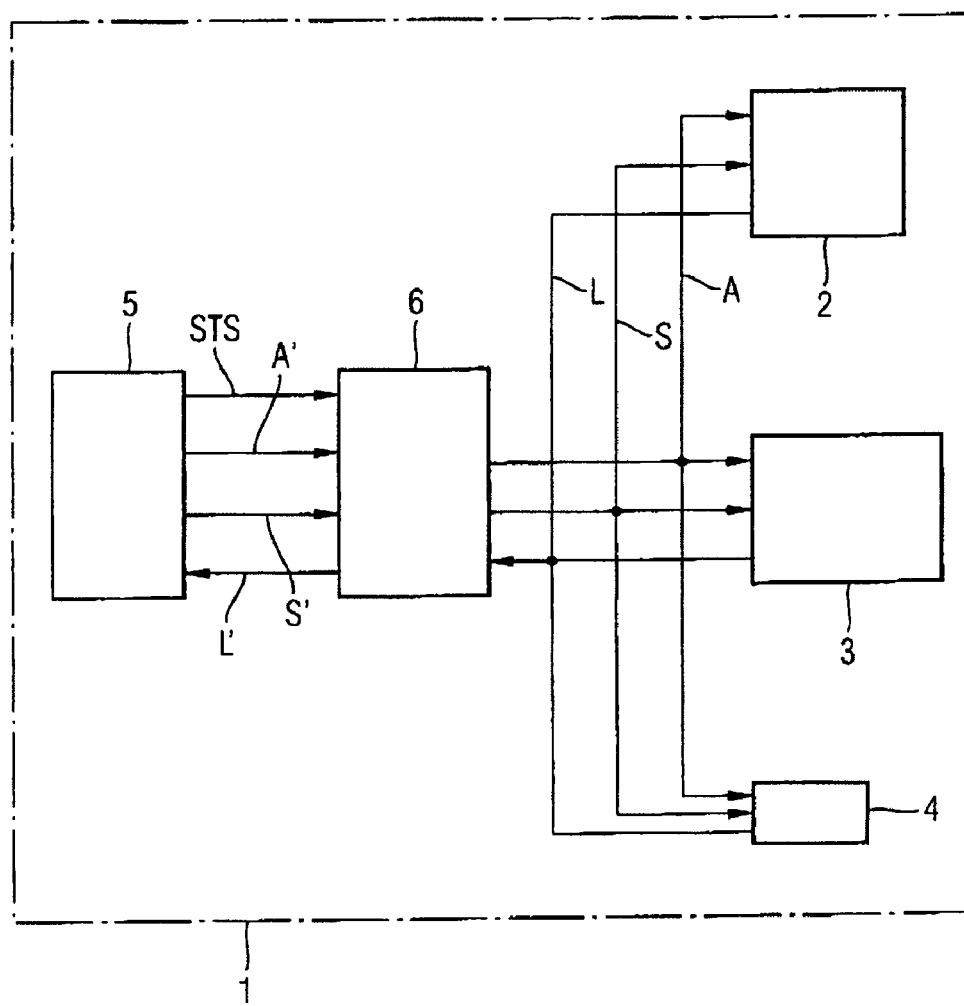
FIG. 3 shows a semiconductor chip according to the invention having embedded memories and a memory self-test controller.

FIG. 3 shows a semiconductor chip 1 according to the invention having embedded memories 2, 3, 4, a central chip controller device 5 and a memory self-test controller 6 according to the invention. The embedded memories 2, 3, 4 have addressable memory cells which are assigned memory addresses from a memory address range.

The memory self-test controller 6 is coupled to the memories 2, 3, 4 via an address bus A for addressing the memory cells and is coupled to the embedded memories 2, 3, 4 via a write/read bus L, S. The bus system L, S, A is illustrated schematically here in the form of arrows indicating addressing A, reading L and writing S. The central chip controller device 5 is coupled to the memory self-test controller 6 via an address line A' and write/read lines S', L'. Furthermore, the central chip controller device 5 and the memory self-test controller 6 are coupled to one another via at least one control line for a control signal STS.

The central chip controller device indicates to the memory self-test controller 6 by means of a memory self-test control signal STS that a memory self-test is to be initiated. As a result, the memory self-test controller 6 or the memory self-test controller registers thereof accept the addresses of the memory area of the actual memory that is to be tested. The central chip controller 5 thus addresses the memory self-test controller registers when it selects addresses from the memory address range. The central chip controller 5 writes memory test configuration data to the memory self-test controller registers via the write and read line S', L'. Said configuration data may have a start address and a stop address, for example, which determine a subrange of the memory to be tested. The memory test configuration data may furthermore select the type of memory test, for example writing and reading of checkerboard patterns.

Figure 4:
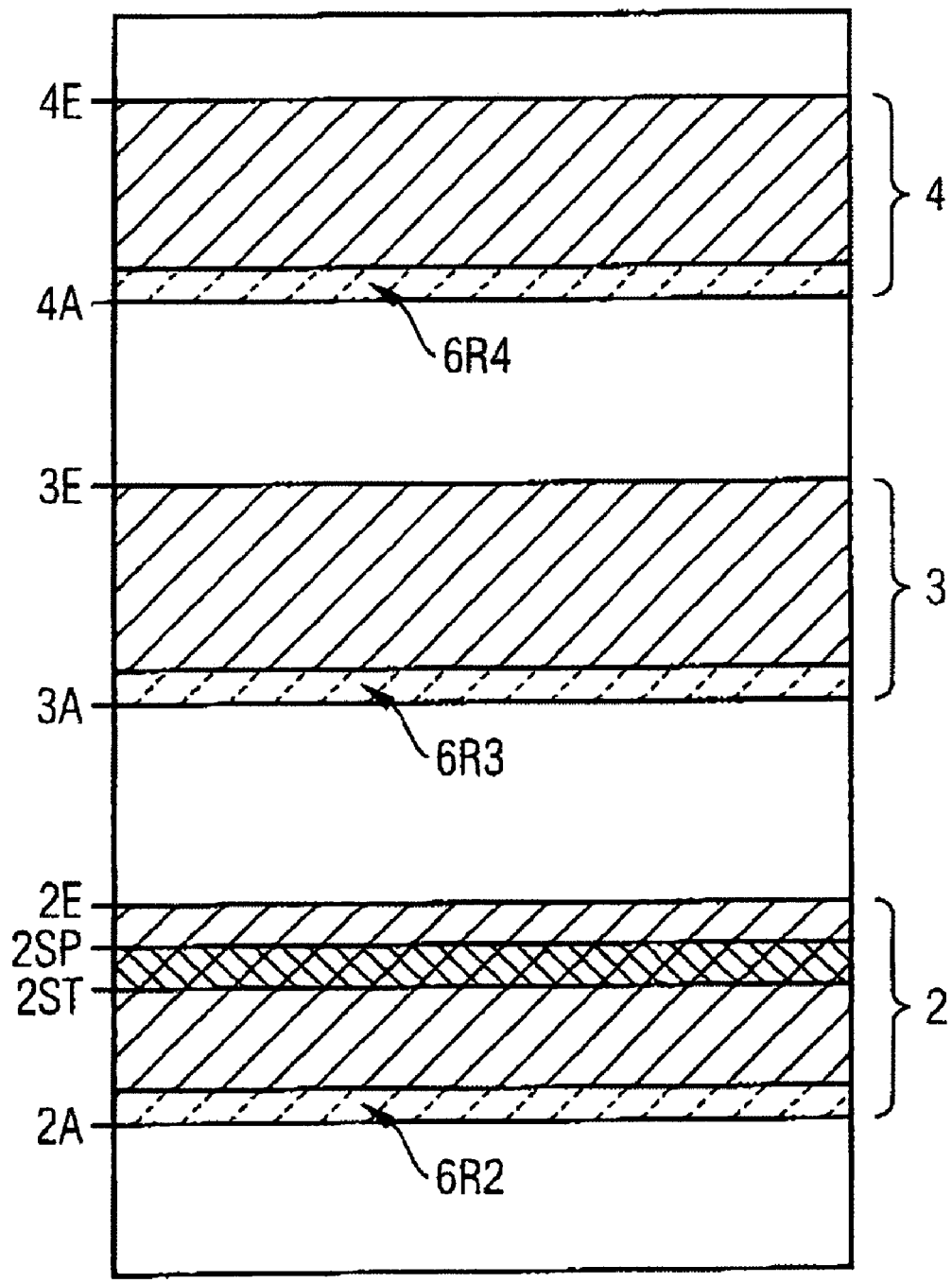
FIG. 4 shows a schematic illustration of the address space according to the invention.

FIG. 4 shows a schematic illustration of the address space according to the invention.

The embedded memories 2, 3, 4 are respectively assigned memory addresses from memory address ranges defined by a beginning memory address 2A, 3A, 4A and an end memory address 2E, 3E, 4E. According to the invention, the memory self-test controller registers are mapped, during a respective memory self-test, onto addresses beginning with the respective beginning address 2A, 3A, 4A of the memories 2, 3, 4 to be tested.

A test of the embedded memory 2 is described below by way of example. The memory self-test controller signal STS informs the memory self-test controller 6 that a memory test on the memory 2 is to be carried out. Consequently, the memory self-test controller registers are mapped onto memory addresses, beginning with the beginning address 2A of the memory 2.

By addressing addresses which follow the beginning address 2A, the central chip controller 5 writes memory test configuration data to the memory self-test controller registers 6R2. These memory test configuration data indicate that a memory self-test is to be carried out in the memory area between the start address 2ST and the stop address 2SP.

The memory self-test controller 6 then addresses the corresponding memory cells of the memory 2 via the address bus A and writes test pattern data to the memory cells. Afterward, the memory self-test controller 6 reads the corresponding memory cell contents and compares them with the test pattern data. A memory cell defect is identified when a read-out memory cell content deviates from the corresponding test pattern datum that was written in.

The memory self-test controller 6 writes the status of the memory self-test to specific locations of its memory self-test controller registers, that is to say—for the central chip controller 5—to an address of the memory area to be tested. The central chip controller 5 can read therefrom the state of the memory area which is to be tested and is delimited by the start address 2ST and the stop address 2SP.

By restricting the memory self-test to a memory subrange, the memory self-test can also take place during operation of the semiconductor chip.

Figure 5:
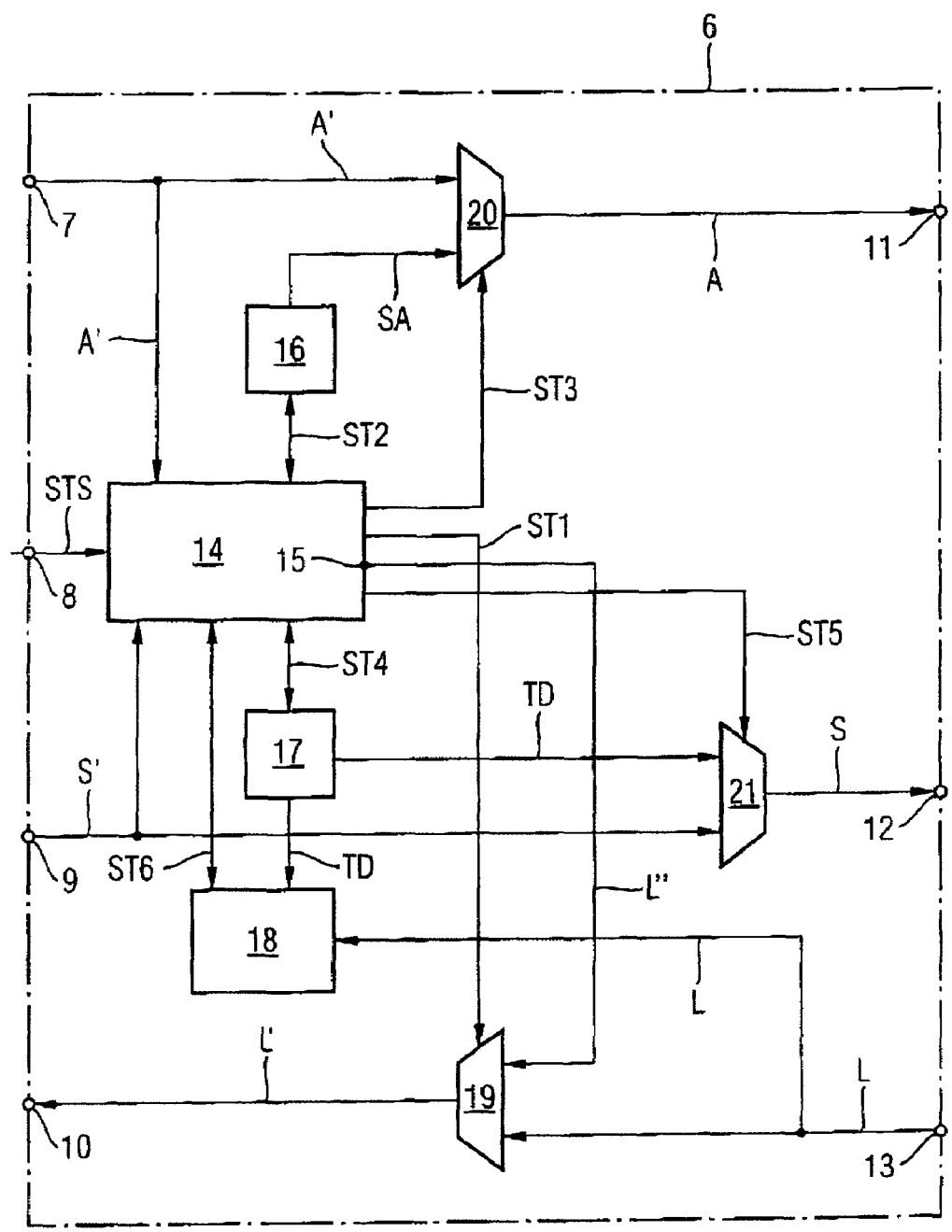
FIG. 5 shows a preferred embodiment of the memory self-test controller according to the invention.

FIG. 5 shows a preferred embodiment of the memory self-test controller 6 according to the invention as a block diagram.

The memory self-test controller 6 has a first input 7 for an address signal A' of the central chip controller 5 (see FIG. 4), a control input 8 for the memory self-test controller signal STS, an input 9 for a write signal S' coming from the central chip controller 5, an output 10 for coupling out a read signal L', an output 11 for coupling out an address signal A into the bus system of the semiconductor chip, an output for a write signal S for coupling out into the bus system of the chip, and an input 13 for coupling in a read signal L from the bus system of the chip.

The memory self-test controller 6 has a control logic 14, an address generator 16, a test data generator 17, a comparison device 18, a first, second and third multiplexer 19, 20, 21.

The control logic 14 coordinates the address, write and read signal flow via the multiplexers 19, 20, 21 and controls the address generator 16, the test data generator 17 and the comparison device 18.

The control logic 14 is coupled via an input to the input 7 for the address signal A' from the central chip controller device and evaluates the address signal A' in a manner dependent on the memory self-test controller signal STS. The control logic has an output 15 for coupling out a register read signal L", which supplies the memory self-test controller register data. If the memory self-test controller signal STS signals a memory self-test, the control logic 14 controls the first multiplexer 19 with a first switching signal ST1 such that a chip controller device receives the register read signal L" as read signal at the output 10 of the memory self-test controller 6. During normal operation, the multiplexer 21 switches through the read signal L from the memory or bus system.

The address generator 16 generates address signals SA, which correspond to addresses of memory cells to be tested, in a manner dependent on a first control signal ST2 generated by the control logic 14. The address signals SA generated by the address generator 16 are passed to the second multiplexer 20, which, in a manner dependent on a second switching signal ST3 of the control logic 14, switches through either the address signal A' of the chip controller device 5 or the signals SA generated by the address generator 16. These are then passed to the output 11 for coupling out into the address bus.

The test data generator 17 is coupled to the control logic 14 via at least one control line for receiving a second control signal ST4. The test data generator 17 generates test data TD, which are passed to the third multiplexer 21. In a manner dependent on a third switching signal ST5 supplied by the control logic 14, the multiplexer 21 switches through either the test data signals TD or the write signal S' supplied by the central chip controller device to the output 12 as write signal for coupling into the write/read bus.

The comparison device 18 is coupled to the control logic 14 via a control line for transmitting third control signals ST6. Furthermore, the comparison device 18 receives the test data signals TD from the test data generator 17.

During normal operation, the first multiplexer 19 switches through the read signals from the read bus or memory by virtue of the first switching signal ST1. The second multiplexer 20 then switches through all the address signals A' from the input 7 for coupling out into the address bus. The third multiplexer 21 then switches through all the write signals S' to the output 12 under the control of the third switching signal ST5 of the control logic 14.

However, if the memory self-test controller signal STS indicates to the control logic 14 that a memory self-test is to be carried out, the addresses from the address range of the memory to be tested are practically diverted to the registers of the memory self-test controller logic 14 since the control logic passes the register read signals L" to the read output 10 via the first multiplexer 19. The write signals S' of the chip controller device are also tapped off by the control logic 14 and passed to the memory self-test controller registers. Memory test configuration data are then written to the latter. The control logic 14 then coordinates the address generator 16, the test data generator 17, the comparison device 18 and the multiplexers 19, 20, 21 such that test pattern data TD are written to the desired memory cells to be tested and are read and the test pattern data are compared with the read memory contents of the memory cells to be tested by the comparison device 18, which continually receives the test pattern data TD and the read signals L, the results being communicated to the control logic via the third control lines ST6. If a read-out memory cell content deviates from the corresponding test pattern datum that was written in, a memory cell defect is identified.

Figure 6:
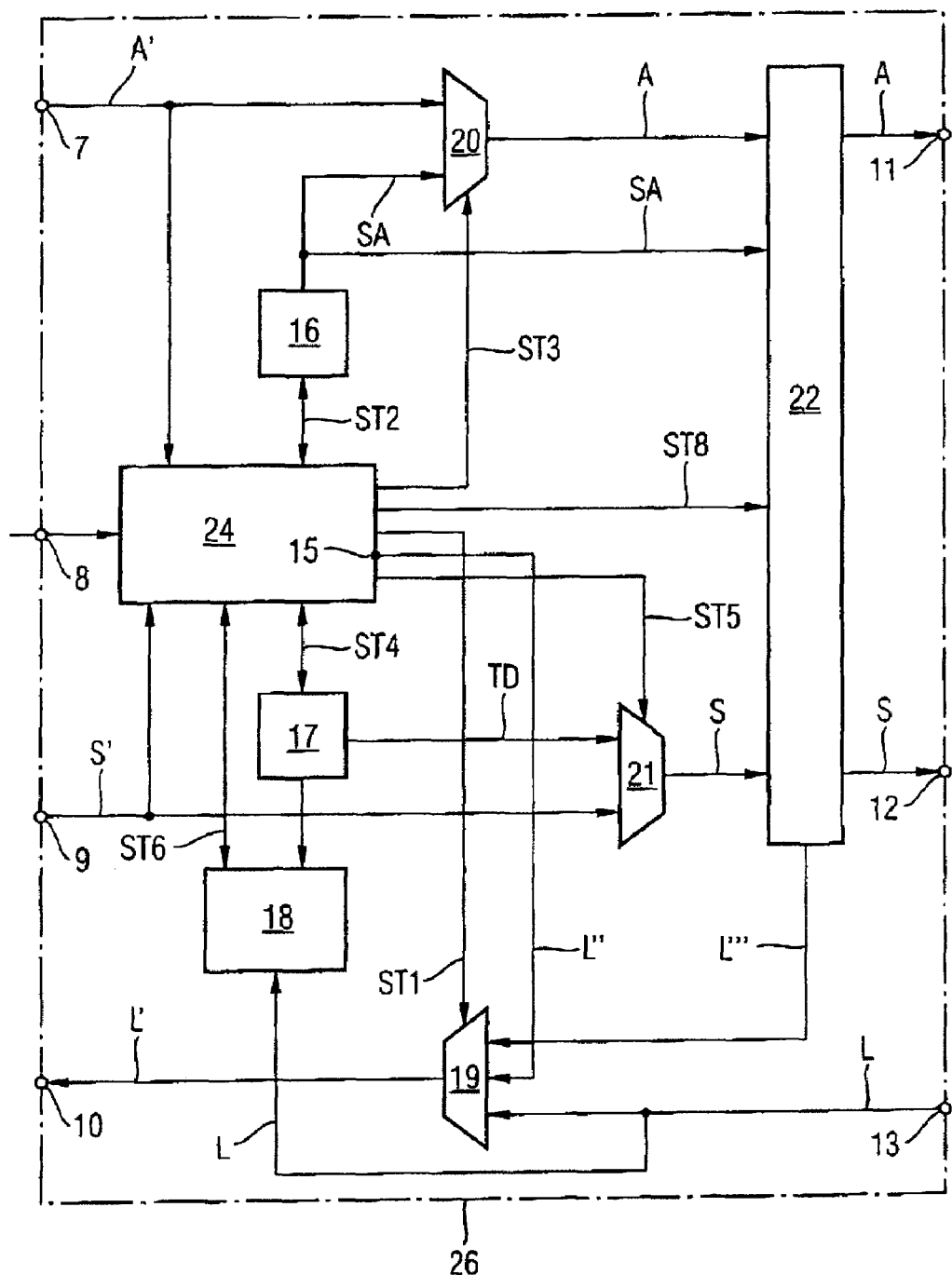
FIG. 6 shows a preferred development of the memory self-test controller according to the invention.

FIG. 6 shows an advantageous development of the memory self-test controller 26 according to the invention.

The advantageous development of the memory self-test controller 26 essentially has the same elements as in FIG. 5, but a redundancy logic 22 is additionally provided.

The redundancy logic 22 is controlled by means of a fourth control signal ST8 from the control logic 24 and has redundancy memory devices. The redundancy logic 22 receives the address signals A switched through by the second multiplexer 20, compares the addressed addresses with a list of addresses of defective memory cells and directs these corresponding addresses to internal redundancy memory devices of the redundancy logic 22. If a defective memory cell is addressed, therefore, in the event of a write access the write signal S switched through by the third multiplexer 21 is passed to a redundancy memory device, or in the event of a read access the redundancy logic 22 supplies a read signal L''', which is passed to the first multiplexer 19, which then passes this read signal L" as read signal to the output 10 or the comparison device 18.

During a memory test, the function of the redundancy logic 22 is switched off, and, upon the occurrence of defective memory cells from the memory to be tested, the control logic 24 writes a corresponding defect mask to the correspondingly provided redundancy memory devices at the replacement address. At the end of a memory test, the central chip controller device can then read out the addresses of the defective memory cells at the bit position of the defects and store them for example in a nonvolatile memory. By virtue of the invention's mapping of the memory self-test controller registers onto the address range of the memories, the central controller device of the chip has direct access to the defect information and can implement corresponding measures without resulting to an external chip tester.

Although the present invention has been explained on the basis of a specific exemplary embodiment it is not restricted thereto, but rather can be implemented in diverse ways. In particular, a wide variety of test algorithms for testing the memory cells to be tested can be carried out including multiply one after the other. The corresponding control information for the memory self-test controller is written to the memory self-test controller registers according to the invention.

It goes without saying that each individual memory present on the system-on-a-chip can also be allocated a memory self-test controller device which controls the test sequences for the corresponding memory. The central chip controller device is then coupled to the memory self-test controller devices via the bus system, and memory self-tests can be carried out in parallel.

The memory self-test controller registers can be mapped onto arbitrarily defined address positions of the address range of the memory to be tested. In the exemplary embodiment, the respective beginning address of the memory to be tested was chosen only by way of example for the beginning of the memory self-test controller registers. Arbitrary standardized positions are possible here.

The method according to the invention and a semiconductor chip according to the invention having embedded memories affords efficient utilization of the addressable space in the system on the semiconductor chip. The method can be used flexibly and can be applied to different combinations of embedded memories. The universal scheme according to which, according to the invention, the memory self-test controller registers are directed to addresses of the memory cells to be tested is suitable for a multiplicity of systems on a semiconductor chip.

I claim:

1. A method for the memory self-test of embedded memories in semiconductor chips, comprising the steps of:
    assigning a memory address range to a memory to be tested, and
    allocating addresses from the same memory address range of the memory to be tested to at least one memory self-test controller register of a memory self-test controller for storing memory test configuration data, wherein the at least one memory self-test controller register is memory mapped within the memory to be tested.

2. The method as claimed in claim 1 wherein the method comprises the following steps:
    (a) provision of at least one memory to be tested having memory cells which are assigned addresses from the memory address range, the memory cells being addressable, readable and writable;
    (b) changing of the assignment of addresses from the memory address range to which the memory cells to be tested are assigned, as a result of which the corresponding addresses are allocated to the at least one memory self-test controller register;
    (c) addressing of the addresses allocated to the memory self-test controller register;
    (d) writing of memory test configuration data in accordance with the addressing;
    (e) selection of addresses of the memory cells to be tested from the memory address range in a manner dependent on the memory test configuration data by the memory self-test controller;
    (f) addressing in accordance with the selected addresses of the memory cells to be tested;
    (g) writing of test pattern data to the memory cells to be tested and read-out of the corresponding memory cell contents of the memory cells to be tested in accordance with the addressing;
    (h) comparison of the test pattern data with the read-out memory contents of the memory cells to be tested, a memory cell defect being identified if a read-out memory cell content deviates from the corresponding test pattern datum that was written in.

3. The method as claimed in claim 2, wherein the memory test configuration data have the start memory address and the stop memory address.

4. The method as claimed in claim 2, wherein the memory address range of the memory to be tested is determined by a beginning and an end memory address, and at least the beginning memory address is allocated to the memory self-test controller register.

5. The method as claimed in claim 1, wherein the memory self-test is carried out in a subrange of the memory to be tested, in which case the subrange can be determined by a start memory address and a stop memory address.

6. The method as claimed in claim 1, wherein the test pattern data have a checkerboard pattern comprising binary logic states, so that different binary states are written to directly adjacent memory cells to be tested of the memory.

7. The method as claimed in claim 1, wherein different test pattern data are successively written to the memory cells to be tested and are read.

8. The method as claimed in claim 1, wherein the test results of defective memory cells are stored during the memory test in a memory that is not to be tested.

9. The method as claimed in claim 1, wherein a largest contiguous defect-free memory area is identified by repeatedly carrying out the memory test method and changing the start and stop addresses.

10. A semiconductor chip having embedded memories, comprising:
    (a) a least one memory having addressable memory cells which are assigned memory addresses from a memory address range;
    (b) a memory self-test controller, which has at least one memory self-test controller register, and which is coupled to the memory via an address bus and a read/write bus;
    (c) a central chip controller device, which is coupled to the memory self-test controller via at least one address line, white line and read line for writing memory test configuration data and at least one control line for a memory self-test controller signal for initiating a memory self-test;
    (d) addresses of the memory address range being allocated to the at least one memory self-test controller register in a manner dependent on a memory self-test controller signal, wherein the at least one memory self-test controller register is memory mapped within the memory to be tested.

11. The semiconductor chip as claimed in claim 10, wherein the memory self-test controller comprises:
a control logic having memory self-test controller registers, an input for the memory self-test controller signal, an input connected to the address line, an output for a register read signal and control outputs for outputting control signals, the control logic evaluating the address signals present on the address line in a manner dependent on the memory self-test controller signal;
an address generator for generating memory addresses and addressing memon cells to be tested in a manner dependent on a second control signal from the control logic;
a test data generator, which is coupled to the control logic via at least one control line, for generating and writing test pattern data to the memory cells to be tested in a manner dependent on a third control signal from the control logic; and
a comparison device, which is coupled to the control logic via at least one line and to the test pattern generator via a line, for reading out and comparing the memory cell contents of the memory cells to be tested in a manner dependent on a fourth control signal from the control logic.

12. The semiconductor chip as claimed in claim 10, wherein provision is made of a redundancy logic comprising redundancy memory devices for replacing defective memory cells of the memory by at least one of the redundancy memory devices, which is assigned a replacement memory address, said redundancy logic being provided between the memory self-test controller and the address, write and read bus, the redundancy logic, in the event of a memory access to a defective memory cell, directing the corresponding access to a redundancy memory device having the corresponding replacement memory address, and the memory self-test controller, during the memory self-test, writing at least one error bit to the redundancy memory device having the corresponding replacement memory address.

13. A device for the memory self-test of embedded memories in semiconductor chips, comprising:
means for assigning a memory address range to a memory to be tested, and
means for allocating addresses from the same memory address range of the memory to be tested to at least one memory self-test controller register of a memory self-test controller for storing memory test configuration data, wherein the at least one memory self-test controller register is memory mapped within the memory to be tested.

14. The device as claimed in claim 13, comprising:
at least one memory to be tested having memory cells which are assigned addresses from the memory address range, the memory cells being addressable, readable and writable;
means for changing of the assignment of addresses from the memory address range to which the memory cells to be tested are assigned, as a result of which the corresponding addresses are allocated to the at least one memory self-test controller register;
means for addressing of the addresses allocated to the memory self-test controller register;
means for writing of memory test configuration data in accordance with the addressing;
means for selecting of addresses of the memory cells to be tested from the memory address range in a manner dependent on the memory test configuration data by the memory self-test controller;
means for addressing in accordance with the selected addresses of the memory cells to be tested;
means for writing of test pattern data to the memory cells to be tested and read-out of the corresponding memory cell contents of the memory cells to be tested in accordance with the addressing;
means for comparing of the test pattern data with the read-out memory contents of the memory cells to be tested, a memory cell defect being identified if a read-out memory cell content deviates from the corresponding test pattern datum that was written in.

15. The device as claimed in claim 14, wherein the memory test configuration data have the start memory address and the stop memory address.

16. The device as claimed in claim 14, wherein the memory address range of the memory to be tested is determined by a beginning and an end memory address, and at least the beginning memory address is allocated to the memory self-test controller register.

17. The device as claimed in claim 13, wherein the memory self-test is carried out in a subrange of the memory to be tested, in which case the subrange can be determined by a start memory address and a stop memory address.

18. The device as claimed in claim 13, wherein the test pattern data have a checkerboard pattern comprising binary logic states, so that different binary states are written to directly adjacent memory cells to be tested of the memory.

19. The device as claimed in claim 13, wherein different test pattern data are successively written to the memory cells to be tested and are read.

20. The device as claimed in claim 13, wherein the test results of defective memory cells are stored during the memory test in a memory that is not to be tested.

* * * * *